(12) United States Patent
Gaertner et al.

(10) Patent No.: US 8,981,394 B2
(45) Date of Patent: Mar. 17, 2015

(54) LIGHT-EMITTING DEVICE

(75) Inventors: Christian Gaertner, Regensburg (DE); Ales Markytan, Regensburg (DE); Jan Marfeld, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 4 days.

(21) Appl. No.: 13/883,217

(22) PCT Filed: Mar. 8, 2012

(86) PCT No.: PCT/EP2012/054019
§ 371 (c)(1),
(2), (4) Date: Aug. 1, 2013

(87) PCT Pub. No.: WO2012/120084
PCT Pub. Date: Sep. 13, 2012

(65) Prior Publication Data
US 2013/0299857 A1    Nov. 14, 2013

(30) Foreign Application Priority Data
Mar. 10, 2011 (DE) .......................... 10 2011 013 504

(51) Int. Cl.
*H01L 33/50* (2010.01)
*H01L 25/075* (2006.01)
*F21Y 113/00* (2006.01)
*H01L 33/00* (2010.01)

(52) U.S. Cl.
CPC ........... *H01L 33/50* (2013.01); *F21Y 2113/005* (2013.01); *F21Y 2113/007* (2013.01); *H01L 25/0753* (2013.01); *H01L 33/0095* (2013.01); *H01L 33/504* (2013.01)
USPC ................................. 257/89; 257/88; 257/98

(58) Field of Classification Search
CPC ... H01L 25/0753; H01L 33/50; H01L 33/504; H01L 33/0095
USPC ...................................... 257/88–103, E33.061
See application file for complete search history.

(56) References Cited

U.S. PATENT DOCUMENTS

| 8,071,988 B2 * | 12/2011 | Lee et al. ......................... 257/88 |
| 2004/0217364 A1 | 11/2004 | Tarsa et al. |
| 2005/0117334 A1 | 6/2005 | Lee et al. |
| 2007/0223219 A1 | 9/2007 | Medendorp, Jr. et al. |
| 2008/0048193 A1 | 2/2008 | Yoo et al. |
| 2011/0291129 A1 * | 12/2011 | Wirth ............................. 257/89 |

FOREIGN PATENT DOCUMENTS

| DE | 10 2007 058 703 A1 | 3/2009 |
| DE | 10 2008 025 864 A1 | 12/2009 |

* cited by examiner

*Primary Examiner* — Cuong Q Nguyen
(74) *Attorney, Agent, or Firm* — Slater & Matsil, L.L.P.

(57) ABSTRACT

A light-emitting device includes at least one first light-emitting semiconductor component, which radiates red light during operation, at least one second light-emitting semiconductor component having a wavelength conversion element, and at least one third light-emitting semiconductor component having a wavelength conversion element. The second and third light-emitting semiconductor components each radiate blue primary light and converted secondary light and the respective superposition of the primary light and the secondary light of the second and third light-emitting semiconductor components has different chromaticity coordinates.

17 Claims, 5 Drawing Sheets

LIGHT-EMITTING DEVICE

This patent application is a national phase filing under section 371 of PCT/EP2012/054019, filed Mar. 8, 2012, which claims the priority of German patent application 10 2011 013 504.9, filed Mar. 10, 2011, each of which is incorporated herein by reference in its entirety.

TECHNICAL FIELD

Embodiments of the present invention relate to a light-emitting device.

BACKGROUND

Light-emitting diodes (LEDs) are nowadays used in many cases for lighting purposes. Since LEDs typically generate narrowband, single-colored light having a quasi-monochromatic spectrum, a plurality of different-colored LEDs or one or a plurality of LEDs having an additional wavelength-converting dye have to be combined in order to generate white light.

A customary combination of LEDs for generating white light comprises quasi-monochromatic red LEDs having a peak wavelength in the range of approximately 600 to 700 nm, quasi-monochromatic green LEDs having a peak wavelength in the range of approximately 530 to 570 nm and quasi-monochromatic blue LEDs having a peak wavelength in the range of approximately 440 to 475 nm. If appropriate, LEDs having further colors can also be added to this so-called RGB combination.

Furthermore, it is also known, in a so-called RBW combination, to combine the abovementioned red and blue LEDs with one or a plurality of white-converted blue LEDs which generate blue light and have a dye that is excited by part of the blue light to emit light having longer wavelengths, which, in superimposition with the unconverted part of the blue light of the LED, produces white light.

By varying the light intensities respectively emitted by the individual LEDs, it is possible to generate different-colored mixed light, for example, also white light having different color temperatures. In this case, however, the individual LEDs are usually operated with low intensities depending on the mixed color to be obtained, as a result of which the total intensity of the mixed light is low. In order to achieve a certain luminous flux, it may be necessary as a result to use a larger number of LEDs, as a result of which the total costs for the LEDs increase.

It is also known to combine at least two or more white-converted LEDs each having a color locus lying on or near the white curve of a Planckian black-body radiator. In this case, the color loci and the white curve relate to the known CIE 1931 colorimetric diagram or CIE standard chromaticity diagram. In the case of such a combination with white-converted LEDs, however, it can happen that the superimposition of the white light respectively emitted itself does not lie on the white curve or at least regions on the white curve cannot be attained, particularly if only two different white-emitting LEDs or LED groups are used.

SUMMARY OF THE INVENTION

At least one specific embodiment specifies a light-emitting device which can emit light having a plurality of wavelengths during operation.

In accordance with at least one embodiment, the light-emitting device comprises at least three light-emitting semiconductor components which emit mutually different-colored light.

Here and hereinafter, visible light can be characterizable, for example, by its color locus with cx and cy color locus coordinates in accordance with the so-called CIE 1931 colorimetric diagram or CIE standard chromaticity diagram known to a person skilled in the art. In this case, different-colored light can be light having different color locus coordinates.

Here and hereinafter, white light or light having a white luminous or color impression can denote light having a color locus which corresponds to the color locus of a Planckian black-body radiator or deviates from the color locus of a Planckian black-body radiator by less than 0.23 and preferably by less than 0.07 in cx and/or cy color locus coordinates.

Furthermore, here and hereinafter, "warm-white" can denote a luminous impression having a color temperature of less than or equal to 4000 K, which can also be designated as "neutral-white," and preferably less than or equal to 3500 K. Furthermore, warm-white color temperature can denote a color temperature of less than or equal to the abovementioned values and greater than or equal to 2000 K and particularly preferably greater than or equal to 2400 K. Here and hereinafter, "cold-white" can denote a white luminous impression having a color temperature of greater than 5500 K. Here and hereinafter, the term "color temperature" can denote the color temperature of a Planckian black-body radiator or else the so-called correlated color temperature (CCT), known to the person skilled in the art, in the case of a white luminous impression in the above-described sense which can be characterized by color locus coordinates that deviate from the color locus coordinates of the Planckian black-body radiators.

In accordance with a further embodiment, a light-emitting semiconductor component comprises a semiconductor chip having an epitaxial layer sequence, that is to say an epitaxially grown semiconductor layer sequence. By way of example, at least one of the light-emitting semiconductor components of the light-emitting device can comprise a semiconductor chip having a semiconductor layer sequence on the basis of InGaAlN. InGaAlN-based semiconductor layer sequences include, in particular, those in which the epitaxially produced semiconductor layer sequence generally comprises a layer sequence composed of different individual layers which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$. Semiconductor chips and semiconductor layer sequences which comprise at least one active layer on the basis of InGaAlN can emit for example preferably electromagnetic radiation in an ultraviolet to green wavelength range and particularly preferably in a blue wavelength range.

Furthermore, at least one light-emitting semiconductor component can also comprise a semiconductor chip having a semiconductor layer sequence on the basis of InGaAlP, that is to say that the semiconductor layer sequence can comprise different individual layers, at least one individual layer of which comprises a material from the III-V compound semiconductor material system $In_xAl_yGa_{1-x-y}P$ where $0 \leq x \leq 1$, $0 \leq y \leq 1$ and $x+y \leq 1$. Alternatively or additionally, at least one light-emitting semiconductor component can comprise a semiconductor layer sequence having at least one layer based on the compound semiconductor material system AlGaAs. Semiconductor chips and semiconductor layer sequences which comprise at least one active layer on the basis of InGaAlP or AlGaAs can emit for example preferably electromagnetic radiation having one or more spectral components in a red wavelength range.

In particular, the semiconductor layer sequences of the light-emitting semiconductor components can emit quasi-monochromatic light, that is to say narrowband, single-colored light whose spectral width usually lies in the range of a few ten nm and is governed by the composition and the construction of the semiconductor layer sequence.

Furthermore, at least one of the light-emitting semiconductor components can have a wavelength conversion element comprising at least one wavelength conversion substance applied on or above a semiconductor chip. The wavelength conversion substance can be suitable for converting at least one part of the light emitted by the semiconductor chip, which light here and hereinafter is also designated as primary light, into longer-wave light, which here and hereinafter is also designated as secondary light. The conversion can particularly preferably concern only one part of the primary light emitted by the semiconductor chip, such that a semiconductor component having a wavelength conversion element can emit a superimposition of converted and unconverted light.

In this case, the wavelength conversion substance can comprise one or more of the following materials: garnets of the rare earths and of the alkaline earth metals, for example, YAG:$Ce^{3+}$, nitrides, nitridosilicates, sions, sialons, aluminates, oxides, halophosphates, orthosilicates, sulfides, vanadates and chlorosilicates. Furthermore, the wavelength conversion substance can additionally or alternatively comprise an organic material which can be selected from a group comprising perylenes, benzopyrenes, coumarins, rhodamines and azo dyes. The wavelength conversion element can comprise suitable mixtures and/or combinations of the wavelength conversion substances mentioned. As a result, it can be possible, for example, that the wavelength conversion element absorbs in a blue first wavelength range and emits in a second wavelength range having green and red wavelengths and/or yellow wavelength ranges.

Furthermore, a wavelength conversion element can comprise a transparent matrix material, which surrounds or contains the wavelength conversion substance or substances or which is chemically bonded to the wavelength conversion substance or substances. The transparent matrix material can comprise, for example, siloxanes, epoxides, acrylates, methyl methacrylates, imides, carbonates, olefins, styrenes, urethanes or derivatives thereof in the form of monomers, oligomers or polymers and furthermore also mixtures, copolymers or compounds therewith. By way of example, the matrix material can comprise or be an epoxy resin, polymethyl methacrylate (PMMA), polystyrene, polycarbonate, polyacrylate, polyurethane or a silicone resin such as, for instance, polysiloxane or mixtures composed thereof.

A wavelength conversion element can be arranged on a semiconductor chip of a light-emitting semiconductor component in the form of a directly applied layer or a lamina. As an alternative thereto, a wavelength conversion element can also be formed by a potting or a part of a potting in which the semiconductor chip of a light-emitting semiconductor component is embedded.

In accordance with a further embodiment, the light-emitting device comprises at least one first light-emitting semiconductor component, which emits red light during operation.

In accordance with a further embodiment, the first semiconductor component comprises a first semiconductor chip, which emits red light. For this purpose, the first semiconductor chip can have a semiconductor layer sequence based on a phosphide or arsenide compound semiconductor material, that is to say in particular an InGaAlP or AlGaAs compound semiconductor material described above. In particular, the first light-emitting semiconductor component can comprise a semiconductor chip which, without a wavelength conversion element disposed downstream, can directly generate the red light with a quasi-monochromatic spectral distribution.

In accordance with a further embodiment, the red light emitted by the first semiconductor component has a so-called peak wavelength in a range of greater than or equal to 600 nm and less than or equal to 700 nm. Here and hereinafter, "peak wavelength" denotes that wavelength of the light emitted by a light-emitting semiconductor component or a semiconductor chip at which the spectral distribution of the emitted light has a global maximum.

In accordance with a further embodiment, the light-emitting device comprises at least one second light-emitting semiconductor component having a wavelength conversion element and at least one third light-emitting semiconductor component having a wavelength conversion element, wherein the second and third light-emitting semiconductor components each emit blue primary light and converted secondary light and the respective superimposition of the primary light and secondary light of the second and third light-emitting semiconductor components has different color locus coordinates. The respective wavelength conversion element can be embodied in accordance with one of the embodiments mentioned above.

In accordance with a further embodiment, the superimposition of the light respectively emitted by the semiconductor components produces white light.

In accordance with a further embodiment, the second and third semiconductor components each comprise at least one semiconductor chip which emits blue primary light. For this purpose, the respective semiconductor chip can comprise in particular a semiconductor layer sequence based on a nitride compound semiconductor material system, that is to say an InGaAlN compound semiconductor material system described above. The blue primary light emitted by the second and/or third semiconductor component can have a peak wavelength that lies in a range of greater than or equal to 430 nm and less than or equal to 480 nm and preferably greater than or equal to 445 nm and less than or equal to 470 nm.

In accordance with a further embodiment, the second light-emitting semiconductor component emits light that lies in a color locus range with the color locus coordinates (cx, cy) where cy≤0.45. In one particularly preferred embodiment, the second light-emitting semiconductor component emits light having a color locus (cx, cy) that lies in a polygonal region in the CIE standard chromaticity diagram with the corners at the color locus coordinates (0.15, 0.25), (0.25, 0.20), (0.40, 0.43) and (0.20, 0.45). In a further particularly preferred embodiment, the second light-emitting semiconductor component emits light having a color locus (cx, cy) for which the following holds true: 0.20≤cx≤0.31 and 0.1≤cy≤0.32.

In accordance with a further embodiment, the third light-emitting semiconductor component emits light that lies in a color locus range with the color locus coordinates (cx,cy) where cy≥0.37. In one particularly preferred embodiment, the third light-emitting semiconductor component emits light having a color locus (cx, cy) that lies in a polygonal region in the CIE standard chromaticity diagram with the corners at the color locus coordinates (0.20, 0.40), (0.37, 0.37), (0.52, 0.48) and (0.22, 0.75). In a further particularly preferred embodiment, the third light-emitting semiconductor component emits light having a color locus (cx, cy) for which the following holds true: 0.35≤cx≤0.45 and 0.44≤cy≤0.61.

In accordance with a further embodiment, the color locus coordinate cy of the light emitted by the second light-emitting semiconductor component is less than or equal to the color locus coordinate cy of the light emitted by the third light-emitting semiconductor component. This can hold true in particular in combination with the color locus coordinate ranges mentioned above.

As a result of the combination of the first, second and third semiconductor components described here and in particular as a result of the two second and third semiconductor components having different degrees of conversion in conjunction with the red-emitting first semiconductor component, a higher efficiency in lumens per watt can be obtained in comparison with the known LED combinations from the prior art. Furthermore, it is possible to achieve a higher color rendering index (CRI), in particular in comparison with the above-described RGB combination from the prior art.

In accordance with a further embodiment, the light-emitting semiconductor components are arranged on a common carrier. The carrier can be formed, for example, by a housing and/or a leadframe and/or a printed circuit board on which the light-emitting semiconductor components are mounted and electrically connected. In this case, the light-emitting device can be embodied as a so-called LED multichip component.

In accordance with a further embodiment, the light-emitting device comprises a plurality of first light-emitting semiconductor components and/or a plurality of second light-emitting semiconductor components and/or a plurality of third light-emitting semiconductor components.

By way of example, the housing can comprise a plastic, in particular a thermoplastic or a thermosetting plastic, which can be produced for example by a molding process such as, for instance, transfer molding, injection molding, compression molding, or a combination thereof. In this case, the plastic can comprise a silicone and/or an epoxy resin or else a silicone-epoxy hybrid material. Furthermore, the housing can also be a ceramic housing.

In accordance with a further embodiment, the carrier has one or a plurality of optical components such as, for instance, a reflector and/or a light-scattering and/or light-refracting element, which are assigned jointly to the light-emitting semiconductor components. The light-scattering and/or light-refracting element can be for example an optical diffuser in the form of a diffusing plate or diffusing film having scattering volume and/or surface elements such as, for instance, scattering particles and/or a surface roughening disposed jointly downstream of the semiconductor components. By means of the optical component, a high spatial color homogeneity of the mixed light emitted by the light-emitting device can be achievable by means of the achievable intermixing of the light respectively emitted by the semiconductor components.

If the light-emitting device comprises, for example, a housing in which the semiconductor components are arranged, then the optical element can serve in particular as a cover of the semiconductor components.

As an alternative thereto, it can also be possible for the light-emitting semiconductor components to be arranged in each case in individual housings or on separate carriers. In this case, the light-emitting device can be formed from the combination of individual LEDs or comprise the latter.

In accordance with a further embodiment, the light-emitting device comprises a current-regulating component, which regulates the respective operating current of the semiconductor components. The current-regulating component can, for example, also have light and/or temperature sensors, by means of which the emitted mixed light can be actively stabilized and regulated to a desired value with regard to its color locus and/or its brightness. By means of the current-regulating component, in particular a tunability of the mixed light emitted by the light-emitting device can also be possible, particularly preferably along the white curve in the CIE standard chromaticity diagram.

In accordance with a further embodiment, the mixed light which is emitted by the light-emitting device and which is formed by a superimposition of the light emitted by the first, second and third light-emitting semiconductor components can be regulatable in a range along the white curve of a Planckian black-body radiator. In particular, the range can comprise a color temperature range of at least greater than or equal to 3000 K or greater than or equal to 2700 K or else greater than or equal to 2400 K and less than or equal to 4000 K or else less than or equal to 5000 K or else less than or equal to 6500 K, in which the mixed light can be set in a targeted manner. In this case, color temperature range can denote a range of color temperatures or correlated color temperatures (CCT). Particularly preferably the mixed light can be regulatable in a color temperature range having a magnitude of greater than or equal to 500 K in a range of greater than or equal to 2400 K and less than or equal to 6500 K.

For a fixedly defined color temperature range, which can be predefined for instance by the application of the light-emitting device, for example, as a lighting device, the minimum luminous flux which can be obtained for a color temperature within the range can be the variable to be maximized. In other words, the lowest luminous flux within the predefined color temperature range is intended to be as high as possible. As a result of the combination of the second and third light-emitting semiconductor components described here, in particular the abovementioned color locus ranges for said components, with the first light-emitting semiconductor component, the individual semiconductor components can be operated with a high luminous flux, in comparison with the known solutions from the prior art, at any desired color temperature in the abovementioned ranges. In particular, it has been possible to ascertain that, in comparison with white-light solutions known from the prior art, the increase in the minimum luminous flux proves to be large particularly when a small number of light-emitting semiconductor components in each of the three classes is used. By way of example, it has been ascertained that with the use of only one first, only one second and only one third semiconductor component, in comparison with the known solutions having one blue-emitting LED and having likewise in each case only one LED per color, the minimum luminous flux per CCT of the non-red portion can prove to be higher by almost 30%.

As a result of the combination of the light-emitting semiconductor components of the light-emitting device as described here, the individual light-emitting semiconductor components can thus be operated in each case with high luminous fluxes for different mixed colors of the light-emitting device, as a result of which the device described here can have a significantly higher emission intensity in comparison with the known mixed-light solutions, that is to say, for example, with the above-described RGB or RBW combinations.

BRIEF DESCRIPTION OF THE DRAWINGS

Further advantages and advantageous embodiments and developments of the invention will become apparent from the embodiments described below in conjunction with the Figures.

In the exemplary embodiments and Figures, identical or identically acting constituent parts may in each case be provided with the same reference signs. The illustrated elements and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

DETAILED DESCRIPTION OF ILLUSTRATIVE EMBODIMENTS

Figure 1A:
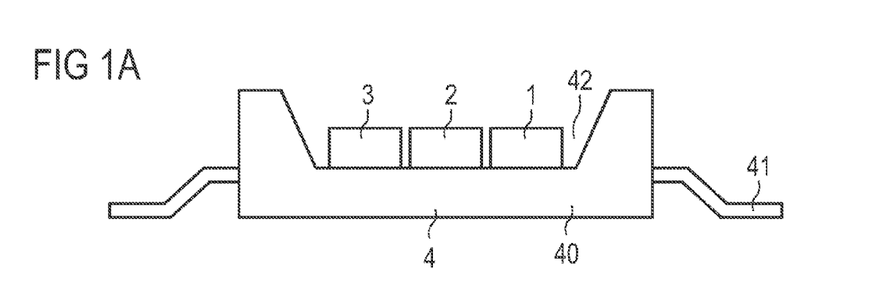
FIG. 1A shows a schematic illustration of a light-emitting device in accordance with one exemplary embodiment.

FIG. 1A shows one exemplary embodiment of a light-emitting device. The light-emitting device comprises a first light-emitting semiconductor component 1, a second light-emitting semiconductor component 2 and a third light-emitting semiconductor component 3, which are arranged and electrically contact-connected in a common housing 4 as a common carrier. During operation, the light-emitting device emits a mixed light which is a superimposition of the light respectively emitted by the semiconductor components 1, 2, 3 during operation and which is white.

In the exemplary embodiment shown, the housing 4 has a housing body 40 produced from a plastic and a leadframe, which is led out from the housing body 40 in the form of electrical connections 41. In particular, dedicated connections 41 can be provided for each semiconductor component 1, 2, 3 in order to be able to drive and operate the semiconductor components 1, 2, 3 separately. For this purpose, the light-emitting device can further comprise a current-regulating component (not shown), which can regulate the current respectively impressed on the semiconductor components 1, 2, 3. The current-regulating component can also be arranged within the housing 4.

The housing body 40 furthermore has a depression 42, in which the semiconductor components 1, 2, 3 are arranged and which can have for example reflective side faces in order to direct the light emitted by the light-emitting semiconductor components 1, 2, 3 into a preferred emission region.

Furthermore, in addition an optical element such as, for example, an optical diffuser in the form of a diffusing film or diffusing plate (not shown) can also be disposed downstream of the semiconductor components 1, 2, 3 in order to intermix the light emitted by the semiconductor components 1, 2, 3 during operation and thus to make it possible to emit the mixed light with a spatially homogeneous color locus.

The light-emitting semiconductor components 1, 2, 3 can in each case also be present in a plurality.

The first light-emitting semiconductor component 1 comprises a semiconductor chip, which, as described in the general part, is based on an InGaAlP or AlGaAs compound semiconductor material and which emits quasi-monochromatic red light having a peak wavelength of greater than or equal to 600 nm and less than or equal to 700 nm during operation.

The second and third light-emitting semiconductor components 2, 3 each comprise a semiconductor chip, which, as described in the general part, is based on an InGaAlN compound semiconductor material and emits quasi-monochromatic blue primary light during operation. Furthermore, the second and third light-emitting semiconductor components 2, 3 each have a wavelength conversion element, which converts part of the respective primary light into a longer-wave secondary light, such that each of the semiconductor components 2, 3 emits a superimposition of the respective primary light and the respective secondary light, wherein the light emitted by the second light-emitting semiconductor component 2 and the light emitted by the third light-emitting semiconductor component 3 have different color locus coordinates.

The respective wavelength conversion elements can be embodied as described in the general part.

In one exemplary embodiment, the second light-emitting semiconductor component 2 emits light having color locus coordinates (cx, cy) where cy≤0.45 and the third light-emitting semiconductor component 3 emits light having color locus coordinates (cx, cy) where cy≥0.37, wherein the color locus coordinate cy of the light emitted by the second light-emitting semiconductor component 2 is less than or equal to the color locus coordinate cy of the light emitted by the third light-emitting semiconductor component 3.

The second light-emitting semiconductor component 2 is thus embodied as a blue LED having a low degree of conversion, while the third light-emitting semiconductor component 3 is embodied as a blue LED having a high degree of conversion.

Figure 2:
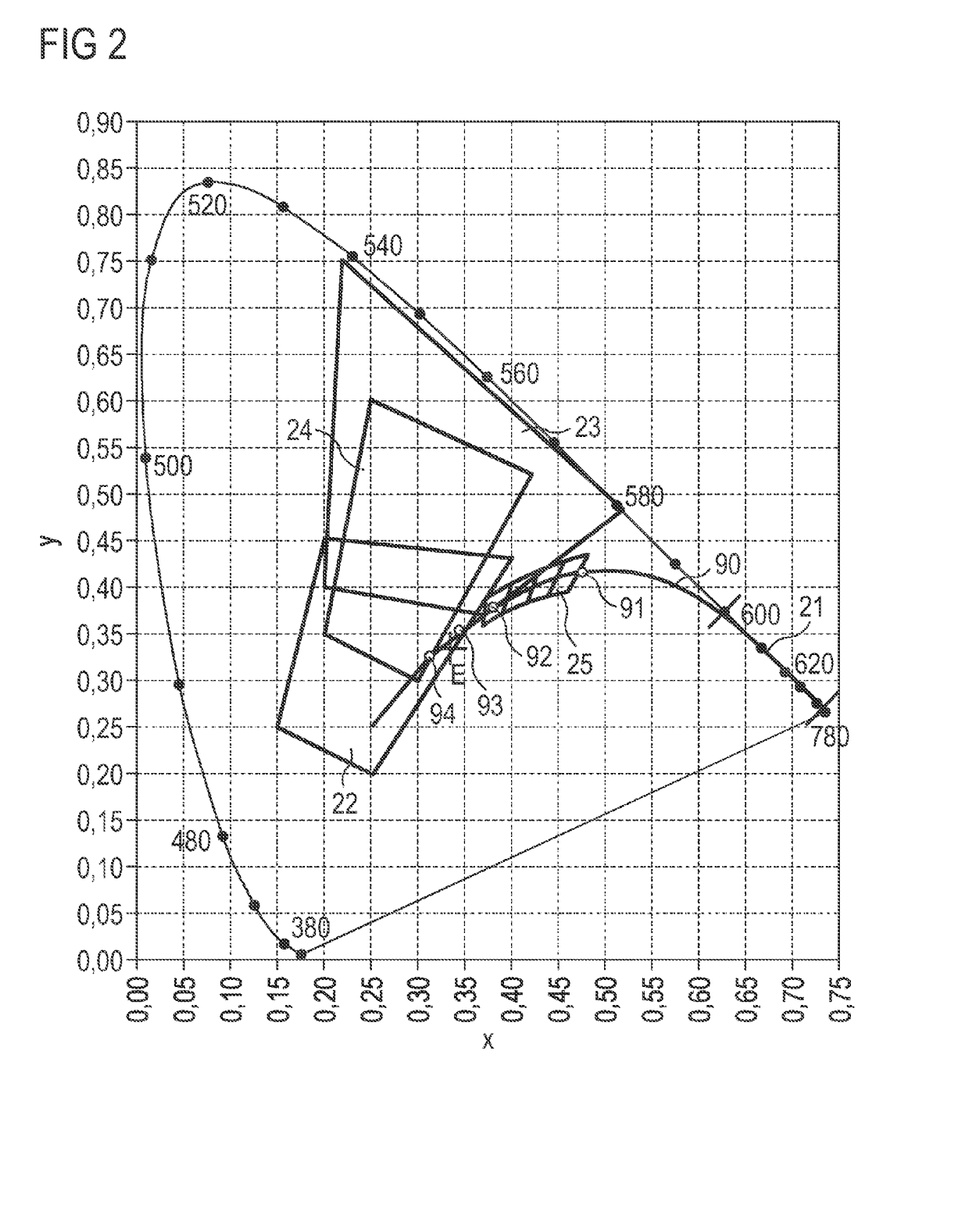
FIGS. 2 and 3 show schematic illustrations of color locus ranges of semiconductor components of light-emitting devices in accordance with further exemplary embodiments.
Figure 3:
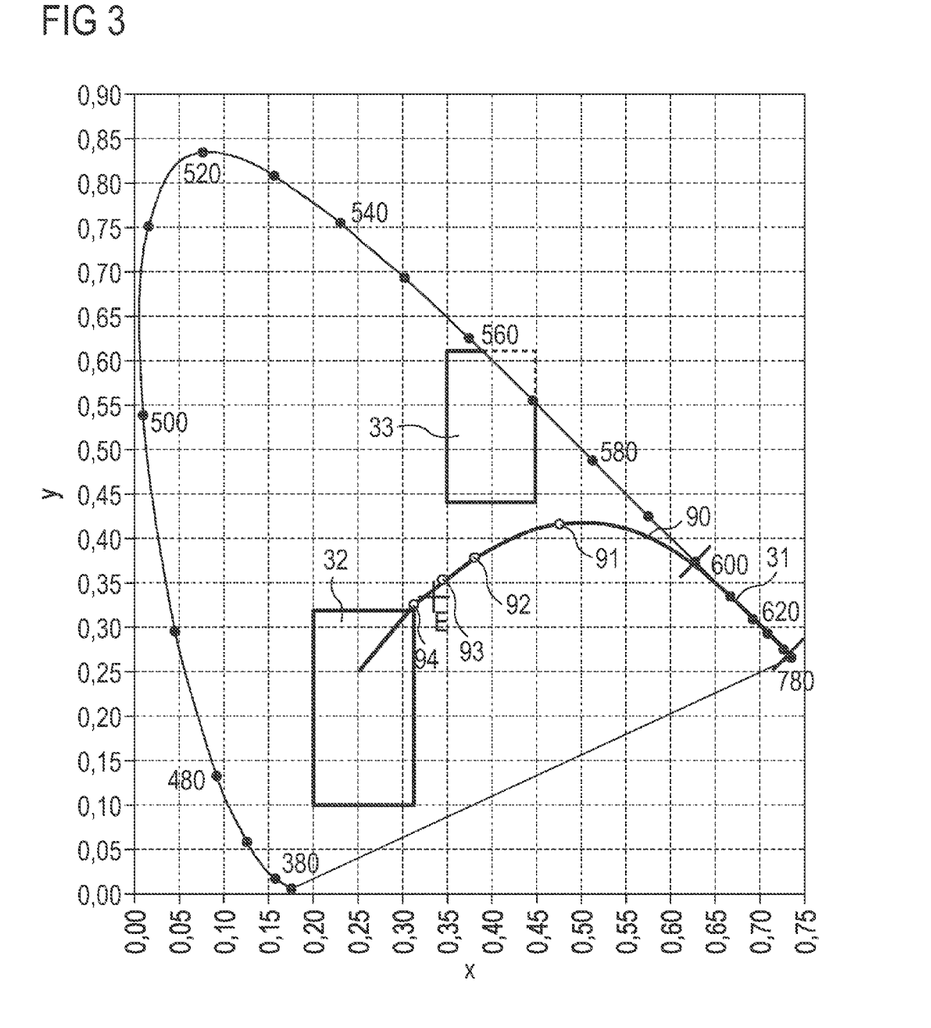

Further exemplary embodiments of the first, second and third light-emitting semiconductor components 1, 2, 3 and the light respectively emitted by the latter, which is particularly suitable for the light-emitting device described here, are shown in conjunction with FIGS. 2 and 3.

Figure 1B:
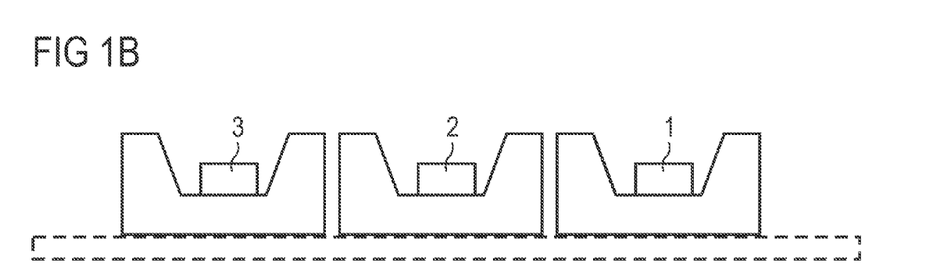
FIG. 1B shows a schematic illustration of a light-emitting device in accordance with a further exemplary embodiment.

FIG. 1B shows a light-emitting device in accordance with a further exemplary embodiment, which, in comparison with the exemplary embodiment in FIG. 1A, comprises the first, second and third semiconductor components 1, 2, 3 in each case in a dedicated housing. The semiconductor components 1, 2, 3 are thus embodied as individual LEDs and can be connected and mounted for example on a common carrier, indicated by the dashed line. The carrier can be a printed circuit board, for example.

The light-emitting semiconductor components 1, 2, 3 and the light-emitting device of the exemplary embodiment of FIG. 1B can comprise further features as described in connection with the exemplary embodiments in FIGS. 1A, 2 and 3 and/or as described in the general part.

FIGS. 2 and 3 in each case illustrate the CIE standard chromaticity diagram, in which the white curve 90 of a Planckian black-body radiator, the mathematical white point E having the color locus coordinates cx=cy=0.33 and, with the reference signs 91, 92, 93 and 94, the color temperatures 2500 K, 4000 K, 5000 K and 6500 K are indicated.

In FIGS. 2 and 3, the color locus range of the first light-emitting semiconductor component 1 is indicated with the reference signs 21 and 31.

In the exemplary embodiment shown in conjunction with FIG. 2, the second light-emitting semiconductor component 2 emits light whose color locus (cx, cy) lies in a polygonal region 22 in the CIE standard chromaticity diagram, which region has the corners at the color locus coordinates (0.15, 0.25), (0.25, 0.20), (0.40, 0.43) and (0.20, 0.45). The third light-emitting semiconductor component 3 emits light whose color locus (cx, cy) lies in a polygonal region 23 in the CIE standard chromaticity diagram with the corners at the color locus coordinates (0.20, 0.40), (0.37, 0.37), (0.52, 0.48) and (0.22, 0.75). In this case, the color locus coordinate cy of the light emitted by the second light-emitting semiconductor component 2 is less than or equal to the color locus coordinate cy of the light emitted by the third light-emitting semiconductor component 3. In this case, the second and third light-emitting semiconductor components preferably emit primary light having a peak wavelength in the range of greater than or equal to 430 nm and less than or equal to 480 nm and preferably of approximately 445 nm.

By means of a regulation of the respective operating currents, the mixed light emitted by the light-emitting device can have color locus coordinates that lie along the white curve 90. Preferably, the mixed light can be regulatable in a color temperature range having a magnitude of greater than or equal to 500 K in a range of greater than or equal to 2400 K and less than or equal to 6500 K. In the exemplary embodiment shown, the particularly preferred color locus coordinates of the mixed light are indicated with the reference sign 25, which lie in a color temperature range of greater than or equal to approximately 2500 K and less than or equal to approximately 4000 K. The region 24 indicates the preferred color locus of the superimposition of the light emitted by the second and third light-emitting semiconductor components and has corner points at the color locus coordinates (0.20, 0.35), (0.30, 0.30), (0.42, 0.52) and (0.25, 0.60).

As an alternative to the mixed-light color temperature range 25 shown, the latter can, for example, also lie between 2400 K and 5000 K and generally lie by a lowest color temperature in the range of 2400 K to 4000 K and a highest color temperature in a range of 4000 K to 6500 K.

In the exemplary embodiment in FIG. 3, the second light-emitting semiconductor component emits light that lies in a region 32 having color loci (cx, cy) for which $0.20 \leq cx \leq 0.31$ and $0.1 \leq cy \leq 0.32$ hold true, while the third light-emitting semiconductor component emits light that lies in a region 33 having color loci (cx, cy) for which $0.35 \leq cx \leq 0.45$ and $0.44 \leq cy \leq 0.61$ hold true, wherein the region 33 contains only those color locus coordinates which lie within the horseshoe-shaped region and can be assigned to possible colors, which is indicated by the dotted and solid line delimiting the region 33.

In order to compare the efficiency of the light-emitting devices described here with known white-light solutions, simulation calculations were carried out, wherein a second light-emitting semiconductor component emitting light having a color locus coordinate cy in the region 22 or 32 in FIGS. 2 and 3 with a variable color locus coordinate cx1 and a third light-emitting semiconductor component emitting light having a color locus coordinate cy in the region 23 or 33 in FIGS. 2 and 3 with a variable color locus coordinate cx2 were used.

For the comparison, an above-described RBW combination was used comprising a blue LED having a peak wavelength at 470 nm and a greenish-converted LED having a variable color locus coordinate cx.

A maximum operating current of 1 A and the same red-emitting first semiconductor component were assumed in both cases.

The results of the simulation calculations are shown in FIGS. 4A to 5B.

Figure 4A:
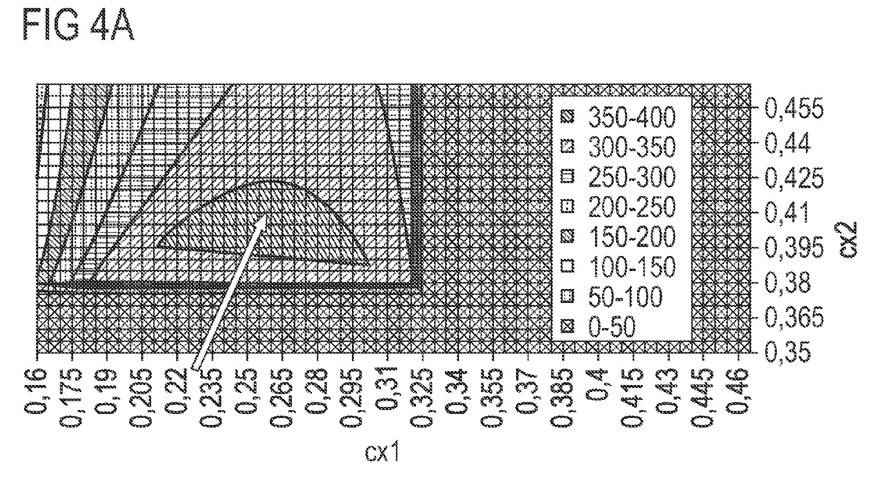
FIGS. 4A-4B and 5A-5B show simulation calculations.
Figure 4B:
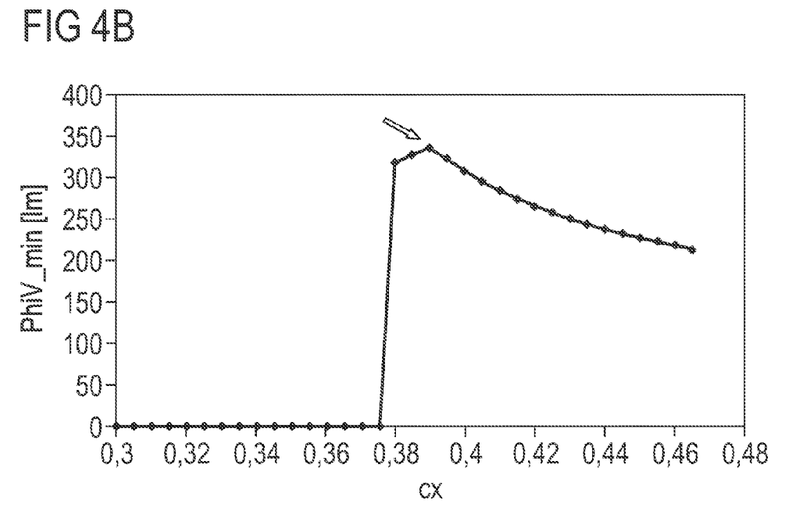

It was determined that for covering a color temperature range of the emitted mixed light of 2400 K to 5000 K, for the light-emitting device described here, it is possible to achieve a minimum luminous flux PhiV_min of 383 lm for the second and third light-emitting semiconductor components for cx1=0.27 and cx2=0.40, while in the case of the RBW combination from the prior art, for the blue and greenish-white converted LED, it is possible to achieve a minimum luminous flux PhiV_min of only 333 lm for cx=0.39, which corresponds to an increase of 15% in comparison with the prior art (see FIGS. 4A and 4B, the arrow in each case indicates the specified value of the minimum luminous flux, and the legend in FIG. 4A indicates the range for PhiV_min in lumens).

Figure 5A:
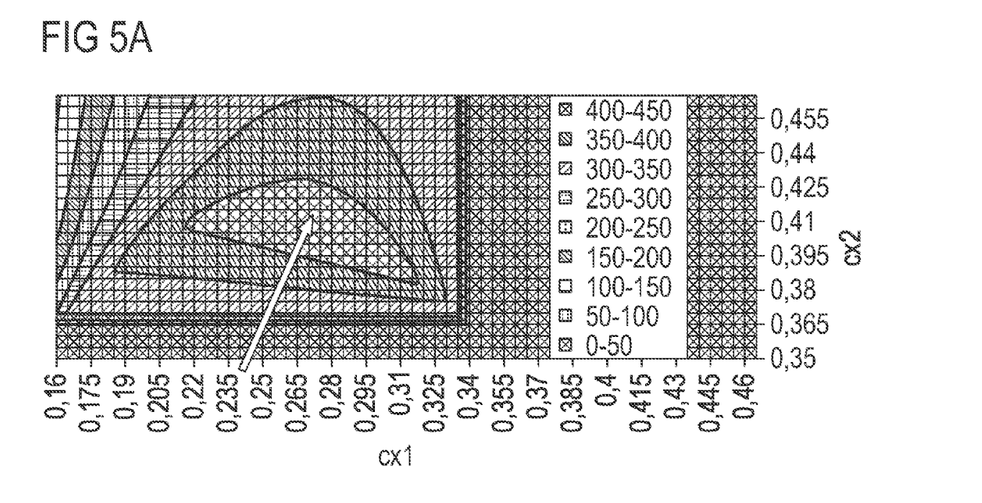
Figure 5B:
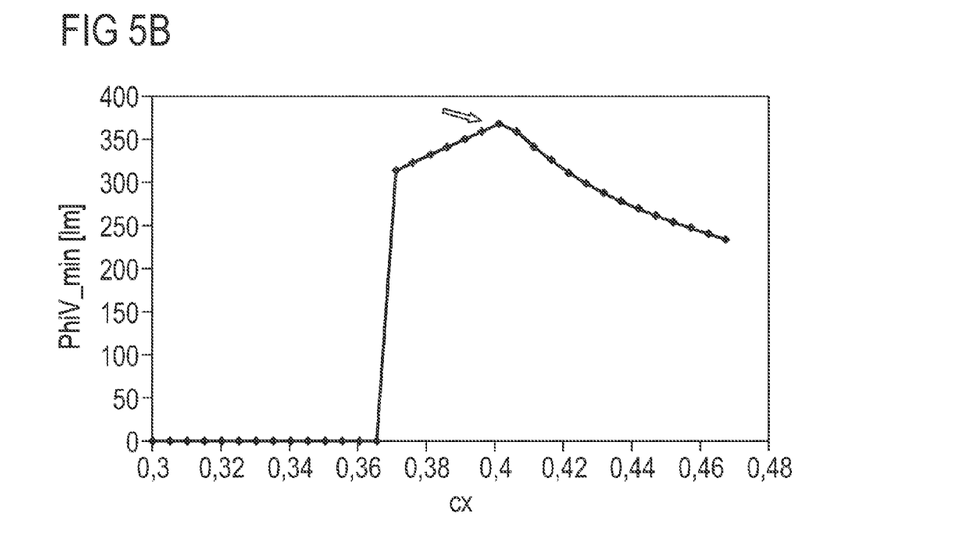

For covering a color temperature range of 2700 K to 4000 K, for the light-emitting device described here, a minimum luminous flux PhiV_min of 449 lm for cx1=0.28 and cx2=0.405 was determined in comparison with 365 lm for cx=0.40 for the known RBW combination, respectively for the second and third light-emitting semiconductor components and the blue and greenish-white converted LEDs, which corresponds to an increase of 23% (see FIGS. 5A and 5B, the arrow indicates in each case the specified value for the minimum luminous flux, and the legend in FIG. 5A indicates a range for PhiV_min in lumens).

In both cases, the red luminous flux portion was respectively a CCT-dependent multiple of the respectively specified luminous flux of the second and third light-emitting semiconductor components and of the blue and greenish-white converted LEDs.

It is thus evident from the simulation calculation that the combinations of the first, second and third semiconductor components as described here makes possible a higher minimum luminous flux in comparison with known white-light solutions for the same operating current in predefined color temperature ranges.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A light-emitting device comprising:
   a first light-emitting semiconductor component, which emits red light during operation;
   a second light-emitting semiconductor component having a wavelength conversion element; and
   a third light-emitting semiconductor component having a wavelength conversion element, wherein the second and third light-emitting semiconductor components each emit blue primary light and converted secondary light and wherein a superimposition of the primary light and secondary light of the second light-emitting semiconductor component has a different color locus coordinate than a superimposition of the primary light and secondary light of the third light-emitting semiconductor component.

2. The light-emitting device according to claim 1, wherein the red light is quasi-monochromatic.

3. The light-emitting device according to claim 1, wherein the red light has a peak wavelength in a range of greater than or equal to 600 nm and less than or equal to 700 nm.

4. The light-emitting device according to claim 1, wherein the blue primary light emitted by the second and/or third light-emitting semiconductor component has a peak wavelength that lies in a range of greater than or equal to 430 nm and less than or equal to 480 nm.

5. The light-emitting device according to claim 1, wherein the second light-emitting semiconductor component emits light having a color locus (cx, cy) where $cy \leq 0.45$, and the third light-emitting semiconductor component emits light having a color locus (cx, cy) where $cy \geq 0.37$, wherein the color locus coordinate cy of the light emitted by the second light-emitting semiconductor component is less than or equal to the color locus coordinate cy of the light emitted by the third light-emitting semiconductor component.

6. The light-emitting device according to claim 1, wherein the second light-emitting semiconductor component emits light having a color locus (cx, cy) that lies in a polygonal region in the CIE standard chromaticity diagram with the corners at the color locus coordinates (0.15, 0.25), (0.25, 0.20), (0.40, 0.43) and (0.20, 0.45), and wherein the third light-emitting semiconductor component emits light having a color locus (cx, cy) that lies in a polygonal region in the CIE standard chromaticity diagram with the corners at the color locus coordinates (0.20, 0.40), (0.37, 0.37), (0.52, 0.48) and (0.22, 0.75), wherein the color locus coordinate cy of the light emitted by the second light-emitting semiconductor component is less than or equal to the color locus coordinate cy of the light emitted by the third light-emitting semiconductor component.

7. The light-emitting device according to claim 6, wherein a superimposition of light emitted by the second and third light-emitting semiconductor components lies in a color locus coordinate range with corner points at the color locus coordinates (0.20, 0.35), (0.30, 0.30), (0.42, 0.52) and (0.25, 0.60).

8. The light-emitting device according to claim 1, wherein the second light-emitting semiconductor component emits light having a color locus (cx, cy) where $0.20 \leq cx \leq 0.31$ and $0.1 \leq cy \leq 0.32$, and wherein the third light-emitting semiconductor component emits light having a color locus (cx, cy) where $0.35 \leq cx \leq 0.45$ and $0.44 \leq cy \leq 0.61$ hold true.

9. The light-emitting device according to claim 1, wherein the first, second and third light-emitting semiconductor components are arranged on a common carrier.

10. The light-emitting device according to claim 9, wherein the first, second and third light-emitting semiconductor components are arranged in a common housing.

11. The light-emitting device according to claim 1, wherein the light-emitting semiconductor components are arranged on separate carriers.

12. The light-emitting device according to claim 11, wherein the light-emitting semiconductor components are arranged in separate housings.

13. The light-emitting device according to claim 1, further comprising a current-regulating component configured to regulate operating currents of the first, second and third light-emitting semiconductor components in such a way that a mixed light emitted by the light-emitting device is regulatable along a white curve of a Planckian black-body radiator at least in a color temperature range having a magnitude of greater than or equal to 500 K.

14. The light-emitting device according to claim 13, wherein the color temperature range is greater than or equal to 2400 K and less than or equal to 6500 K.

15. The light-emitting device according to claim 1, wherein the light-emitting device comprises a plurality of first light-emitting semiconductor components, a plurality of second light-emitting semiconductor components and a plurality of third light-emitting semiconductor components.

16. A light-emitting device comprising:
a first light-emitting semiconductor component, which emits red light during operation,
a second light-emitting semiconductor component having a wavelength conversion element; and
a third light-emitting semiconductor component having a wavelength conversion element;
wherein the second and third light-emitting semiconductor components each emit blue primary light and converted secondary light;
wherein the blue primary light emitted by the second light-emitting semiconductor component has a peak wavelength that lies in a range of greater than or equal to 430 nm and less than or equal to 480 nm;
wherein the blue primary light emitted by the third light-emitting semiconductor component has a peak wavelength that lies in a range of greater than or equal to 430 nm and less than or equal to 480 nm;
wherein a superimposition of the primary light and secondary light of the second light-emitting semiconductor component has different color locus coordinate than a superimposition of the primary light and secondary light of the third light-emitting semiconductor component;
wherein the second light-emitting semiconductor component emits light having a color locus (cx, cy) for which $0.20 \leq cx \leq 0.31$ and $0.1 \leq cy \leq 0.32$ hold true; and
wherein the third light-emitting semiconductor component emits light having a color locus (cx, cy) for which $0.35 \leq cx \leq 0.45$ and $0.44 \leq cy \leq 0.61$ hold true.

17. The light-emitting device of claim 16, wherein the blue primary light emitted by the second light-emitting semiconductor component has a peak wavelength that lies in a range of greater than or equal to 445 nm and less than or equal to 470 nm; and
wherein the blue primary light emitted by the third light-emitting semiconductor component has a peak wavelength that lies in a range of greater than or equal to 445 nm and less than or equal to 470 nm.

* * * * *